(12) United States Patent
Yuh et al.

(10) Patent No.: US 9,881,676 B1
(45) Date of Patent: Jan. 30, 2018

(54) SENSE AMPLIFIER WITH PROGRAM BIASING AND FAST SENSING

(71) Applicant: SanDisk Technologies LLC, Plano, TX (US)

(72) Inventors: Jong Hak Yuh, Pleasanton, CA (US); Raul Adrian Cernea, Santa Clara, CA (US); Seungpil Lee, San Ramon, CA (US); Yen-Lung Jason Li, San Jose, CA (US); Qui Nguyen, San Jose, CA (US); Tai-Yuan Tseng, Milpitas, CA (US); Cynthia Hsu, Fremont, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/290,818

(22) Filed: Oct. 11, 2016

(51) Int. Cl.
*G11C 7/10* (2006.01)
*G11C 16/12* (2006.01)
*G11C 16/26* (2006.01)
*G11C 16/04* (2006.01)
*G11C 16/08* (2006.01)
*G11C 16/24* (2006.01)

(52) U.S. Cl.
CPC .......... *G11C 16/12* (2013.01); *G11C 16/0483* (2013.01); *G11C 16/08* (2013.01); *G11C 16/24* (2013.01); *G11C 16/26* (2013.01)

(58) Field of Classification Search
USPC ............................ 365/189.09, 195, 196, 203
See application file for complete search history.

(56) References Cited

U.S. PATENT DOCUMENTS

| 4,903,237 | A | * | 2/1990 | Rao | ........................ | G11C 16/28 |
| | | | | | | 327/52 |
| 5,978,267 | A | | 11/1999 | Chen et al. | | |
| 6,229,734 | B1 | * | 5/2001 | Watanabe | .......... | G11C 16/3404 |
| | | | | | | 365/185.18 |
| 7,177,197 | B2 | | 2/2007 | Cernea | | |
| 7,545,180 | B2 | | 6/2009 | Goel et al. | | |
| 7,688,648 | B2 | | 3/2010 | Kim | | |
| 7,764,544 | B2 | | 6/2010 | Mokhlesi | | |
| 2010/0118595 | A1 | * | 5/2010 | Bae | ........................ | G11C 5/145 |
| | | | | | | 365/148 |
| 2010/0271871 | A1 | * | 10/2010 | Yamada | ............. | G11C 16/0433 |
| | | | | | | 365/185.2 |
| 2011/0058423 | A1 | * | 3/2011 | Fujimura | ................ | G11C 16/12 |
| | | | | | | 365/185.17 |
| 2012/0163083 | A1 | | 6/2012 | Dutta et al. | | |
| 2013/0033937 | A1 | * | 2/2013 | Aritome | ................. | G11C 16/10 |
| | | | | | | 365/185.22 |
| 2014/0119126 | A1 | | 5/2014 | Dutta et al. | | |
| 2017/0047107 | A1 | * | 2/2017 | Berger | ................ | G11C 11/1677 |

* cited by examiner

*Primary Examiner* — Vu Le
(74) *Attorney, Agent, or Firm* — Kunzler, PC (57) ABSTRACT

Apparatuses, systems, and methods are disclosed for accessing non-volatile memory. A bit line is coupled to storage cells for a non-volatile memory element. A sense amplifier is coupled to a bit line. A sense amplifier includes a sense circuit and a bias circuit. A sense circuit senses an electrical property of a bit line for reading data from one or more storage cells, and a bias circuit applies a bias voltage to the bit line for writing data to one or more storage cells. A bias circuit and a sense circuit comprise separate parallel electrical paths within a sense amplifier.

20 Claims, 6 Drawing Sheets

SENSE AMPLIFIER WITH PROGRAM BIASING AND FAST SENSING

TECHNICAL FIELD

The present disclosure, in various embodiments, relates to sense amplifiers for non-volatile memory, and more particularly relates to a sense amplifier with program biasing and fast sensing.

BACKGROUND

In various types of non-volatile memory, bit lines may connect columns or strings of storage cells. A bias voltage may be applied to bit lines for programming storage cells, and an inhibit voltage may be applied to bit lines for inhibiting storage cells from being programmed. To read data from storage cells, sense amplifiers coupled to the bit lines may sense bit line voltages, and output recognizable logic levels based on the bit line voltages. In certain types of non-volatile memory, programming or writing data to storage cells may take significantly longer than reading data from the storage cells.

SUMMARY

Apparatuses are presented for accessing non-volatile memory. In one embodiment, a bit line is coupled to storage cells for a non-volatile memory element. In a certain embodiment, a sense amplifier is coupled to a bit line. In a further embodiment, a sense amplifier includes a sense circuit and a bias circuit. In one embodiment, a sense circuit senses an electrical property of a bit line for reading data from one or more storage cells. In a further embodiment, a bias circuit applies a bias voltage to a bit line for writing data to one or more storage cells. In certain embodiments, a bias circuit and a sense circuit comprise separate parallel electrical paths within a sense amplifier.

Methods are presented for accessing non-volatile memory. In one embodiment, a method includes reading a first data set from a non-volatile storage element. In a certain embodiment, a non-volatile storage element may include a plurality of storage cells, a plurality of bit lines coupled to the storage cells, and/or a plurality of sense amplifiers coupled to the bit lines. In a further embodiment, reading a first data set may include sensing voltages of one or more bit lines. In certain embodiments, a method includes writing a second data set to a non-volatile storage element. In further embodiments, writing a second data set may include applying bias voltages to one or more bit lines. In one embodiment sense amplifiers include sense circuits for sensing bit line voltages and bias circuits for applying bit line bias voltages. In a further embodiment, capacitances of bias circuits are greater than capacitances of the sense circuits. Bias circuits and sense circuits, in one embodiment, are separately coupled to bit lines in parallel.

An apparatus, in another embodiment, includes means for sensing a voltage for a bit line, for reading data from one or more storage cells of a non-volatile memory element. In a certain embodiment, a non-volatile memory element comprises a plurality of storage cells. In a further embodiment, an apparatus includes means for biasing a bit line to a bias voltage, for programming data to one or more storage cells. In one embodiment, a sense amplifier comprises means for sensing and means for biasing. In a further embodiment, a capacitance of a means for sensing is less than a capacitance of a means for biasing.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of preceding figures. Like numbers may refer to like elements in the figures, including alternate embodiments of like elements.

Figure 1:
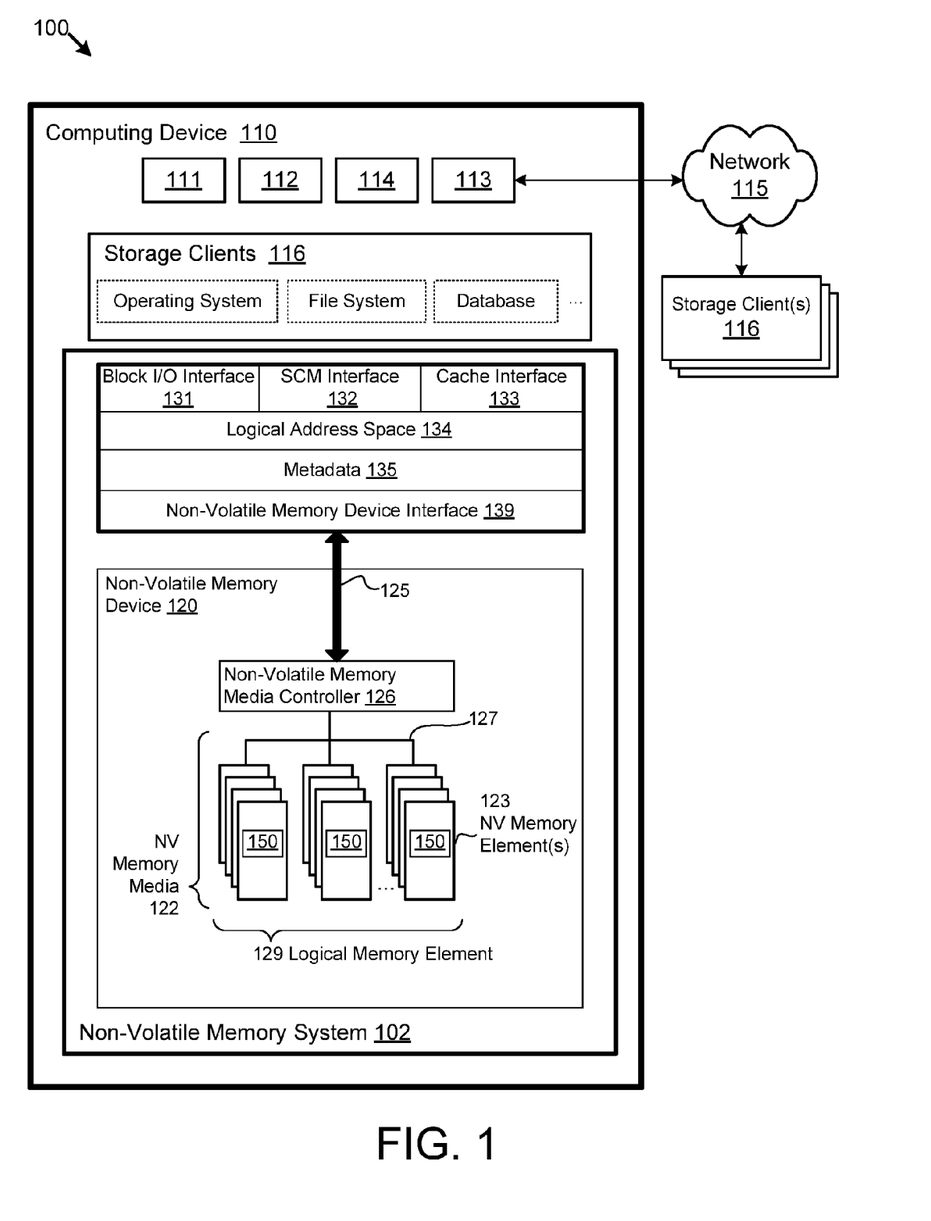
FIG. 1 is a schematic block diagram illustrating one embodiment of a system comprising a sense/bias component.

FIG. 1 is a block diagram of one embodiment of a system 100 comprising a sense/bias component 150 for a non-volatile memory device 120. The sense/bias component 150 may be part of and/or in communication with one or more of a non-volatile memory media controller 126, a non-volatile memory element 123, a device driver, or the like. The sense/bias component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 124 to a communication network 115, such as an Internet Protocol network, a Storage Area Network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, one or more portions of the sense/bias component 150 may be embodied as one or more computer readable instructions stored on the non-transitory storage media 114.

The non-volatile memory system 102, in the depicted embodiment, includes one or more sense/bias components 150. A sense/bias component 150, in one embodiment, includes one or more sense circuits that sense one or more electrical properties of bit lines for reading data from one or more or the non-volatile memory elements 123, and one or more bias circuits that apply bias voltages to the bit lines for writing data to one or more or the non-volatile memory elements 123. A sense amplifier may include a bias circuit and a sense circuit, and the capacitance of the bias circuit may be greater than the capacitance of the sense circuit. In one embodiment, a sense/bias component 150 may include a single sense amplifier, including a bias circuit and a sense circuit, and a non-volatile memory element 123 may include multiple sense/bias components. In another embodiment, a sense/bias component 150 may include multiple sense amplifiers for a non-volatile memory element 123, so that a non-volatile memory element 123 includes one sense/bias component 150 with multiple sense amplifiers.

In a certain embodiment, capacitances of the bias circuits are greater than capacitances of the sense circuits. In one embodiment, reading data from a storage cell of a non-volatile memory element 123 may include precharging a bit line coupled to the storage cell and sensing whether the bit line discharges through the storage cell (e.g., by sensing a bit line voltage, a rate of change for a bit line voltage, a bit line current, or the like). A sense circuit coupled to the bit line to sense whether the bit line discharges may affect the amount of time it takes to precharge and/or discharge the bit line; thus, a higher-capacitance sense circuit may result in longer read times than a lower-capacitance sense circuit. Conversely, in a further embodiment, writing data to a storage cell may include applying a bias voltage to a bit line coupled to the storage cell, and applying one or more program voltage pulses to a control gate. A higher-capacitance bias circuit coupled to the bit line to apply the bias voltage may stabilize the bias voltage over the course of multiple program voltage pulses. Thus, in certain embodiments, a sense/bias component 150 including a sense circuit and a bias circuit, where the capacitance of the bias circuit is greater than the capacitance of the sense circuit, may provide fast read operations and stable program operations.

In one embodiment the sense/bias component 150 may comprise logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the sense/bias component 150 may comprise executable software code, such as a device driver or the like, stored on the computer readable storage medium 114 for execution on the processor 111. In a further embodiment, the sense/bias component 150 may include a combination of both executable software code and logic hardware.

In one embodiment, the sense/bias component 150 is configured to receive requests from a device driver or other executable application via a bus 125 or the like. The sense/bias component 150 may be further configured to communicate with a device driver or other application via the bus 125. Accordingly, the sense/bias component 150, in some embodiments, may comprise and/or be in communication with one or more direct memory access (DMA) modules, remote DMA modules, bus controllers, bridges, buffers, and so on to facilitate communication of data. In another embodiment, the sense/bias component 150 may receive requests as an API call from a storage client 116, as an IO-CTL command, or the like. The sense/bias component 150 is described in greater detail below with regard to FIGS. 3, 4A, and 4B.

According to various embodiments, a non-volatile memory controller 126 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations the on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise a non-volatile recording media capable of recording data, which may be referred to as a non-volatile memory media, a non-volatile storage media, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, expansion cards, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above.

Figure 2:
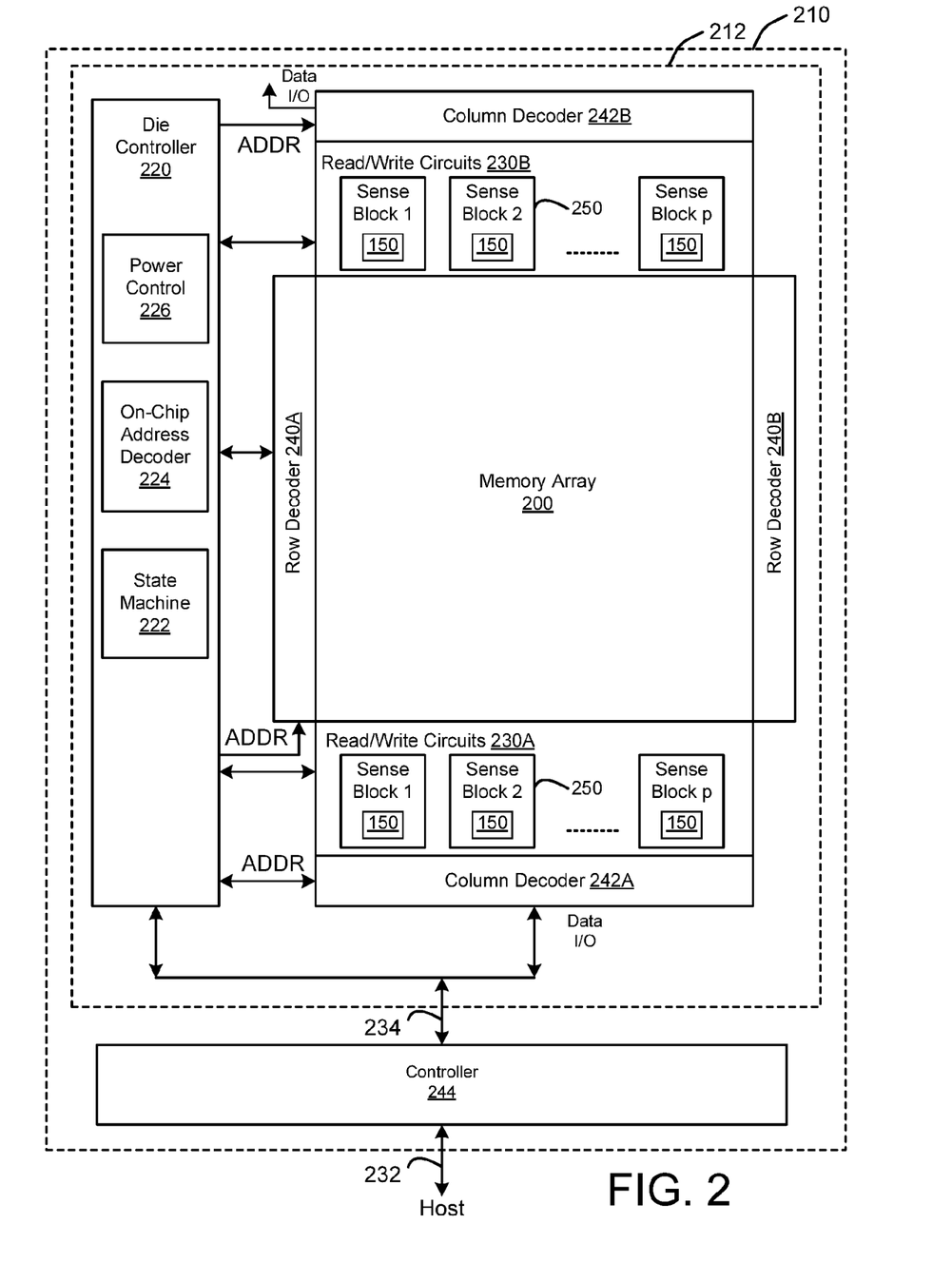
FIG. 2 is a schematic block diagram illustrating one embodiment of a non-volatile storage device comprising a sense/bias component.

FIG. 2 illustrates an embodiment of a non-volatile storage device 210 that may include one or more memory die or chips 212. The non-volatile storage device 210 may be substantially similar to the non-volatile memory device 120 described with reference to FIG. 1. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes a state machine 222, an on-chip address decoder 224, and a power control circuit 226.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. The power control circuit 226 controls the power and voltages supplied to the word lines and bit lines during memory operations. In one embodiment, power control circuit 226 includes one or more charge pumps that can create voltages larger than the supply voltage.

In one embodiment, the sense blocks 250 may include sense/bias components 150, which may be substantially similar to the sense/bias components 150 described above with regard to FIG. 1.

An individual sense block 250 may be partitioned into one or more core portions, referred to as sense modules or sense amplifiers, and a common portion, referred to as a managing circuit. In one embodiment, there will be a separate sense amplifier coupled to each bit line and one common managing circuit for a set of multiple (e.g., four or eight) sense amplifiers. Each of the sense amplifiers in a group may communicates with the associated managing circuit via a data bus.

A sense amplifier of a sense/bias component 150 may include a sense circuit that determines or senses an electrical property (e.g., voltage, current) of a bit line for reading data. A sense block 250 may also include one or more bit line latches to store data that has been read via a bit line, or data to be written to a bit line. A sense amplifier of a sense/bias component 150 may further include a bias circuit that applies a bias voltage to the bit line for writing data. In one embodiment, the bias voltage may be based on data to be written via the bit line, the contents of the bit line latches, or the like. A sense/bias component 150, in certain embodiments, may include one or more sense amplifiers (including associated sense and bias circuits), managing circuits of sense blocks 250, and/or further management software and/or hardware of a device controller 244, a die controller 220 and/or a state machine 222.

Figure 3:
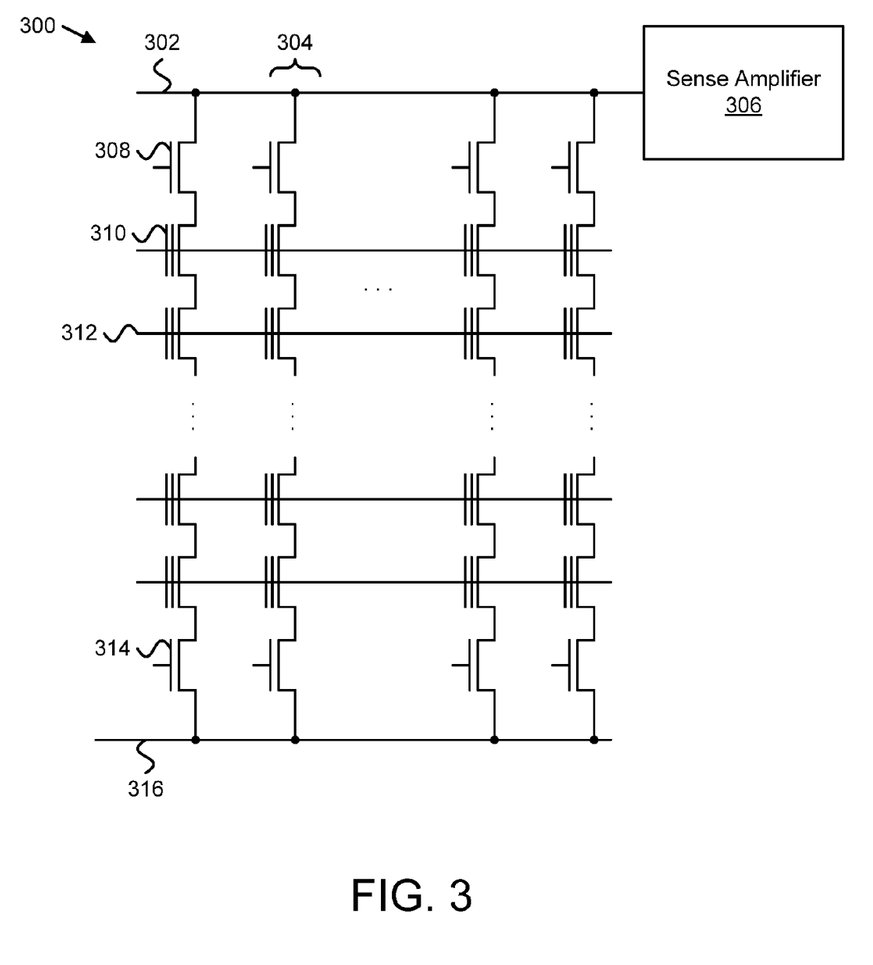
FIG. 3 is a schematic diagram illustrating one embodiment of an apparatus for accessing non-volatile memory.

FIG. 3 depicts one embodiment of an apparatus 300 for accessing non-volatile memory. In the depicted embodiment, the apparatus 300 includes a bit line 302, one or more NAND strings 304, a sense amplifier 306, word lines 312, and a source line 316. In a certain embodiment, a sense/bias component 150, as described above in relation to FIGS. 1 and 2, may include a bit line 302 and a sense amplifier 306 of an apparatus 300, multiple sense amplifiers 306 associated with multiple bit lines 302, or the like.

In the depicted embodiment, a NAND string 304 includes a plurality of floating gate transistors 310. In a floating gate transistor 310, a conductive "floating" gate is positioned over a channel region of a semiconductor substrate, between source and drain regions. A control gate is positioned over the floating gate. The floating gate is electrically isolated (e.g., by oxide layers) from the control gate and the substrate, and may store a charge. The charge on a floating gate may be increased (e.g., during programming) or decreased (e.g., during erasure) by Fowler-Nordheim tunneling, hot carrier injection, or the like. Because the floating gate is between the control gate and the substrate, the amount of charge on the floating gate may affect the "threshold voltage" $V_t$ that is sufficient to turn the floating gate transistor 310 "on" (e.g., to create a conductive channel between source and drain regions) when applied to the control gate. Thus, the amount of charge on the floating gate, or, equivalently, the threshold voltage $V_t$ for the floating gate transistor 310 may be manipulated to store data.

In one embodiment, in "single level cell" (SLC) NAND flash memory, a single read voltage threshold may be established for a floating gate transistor 310, so that the floating gate transistor 310 is in an erased state (e.g., storing a binary "1") if the threshold voltage $V_t$ for the cell is below the read voltage threshold, and in a programmed state (e.g., storing a binary "0") if the threshold voltage $V_t$ for the cell is above the read voltage threshold. In another embodiment, for "multi level cell" (MLC), "triple level cell" (TLC) NAND flash memory, or the like, a range of possible threshold voltages $V_t$ for a floating gate transistor 310 may be divided into multiple states, so that the floating gate transistor 310 stores more than one bit of data. In general, in various embodiments, reading data from a floating gate transistor 310 may include determining which state the threshold voltage $V_t$ of the floating gate transistor 310 is in, by applying a read voltage to the control gate and determining whether the floating gate transistor 310 conducts between source and drain terminals. Similarly, writing data to a floating gate transistor 310 may include applying program voltage pulses to the control gate, or applying erase voltage pulses to the substrate, to change the threshold voltage $V_t$ of the floating gate transistor 310.

Although data is stored in floating gate transistors 310 in the depicted embodiment, data in another embodiment may be stored by varying certain physical properties of other types of electrical components. For example, data may be stored by varying the resistance of a component in ReRAM, the phase of a component in PCM, or the like. A component, such as a floating gate transistor 310, with a physical property that may be altered to store data may be referred to herein as a "storage cell," a "memory cell" or the like. Thus, in the depicted embodiment, the memory array 200 of FIG. 2 may include multiple storage cells, comprising floating gate transistors 310 in NAND strings 304. In another embodiment, however, the memory array 200 of FIG. 2 may include multiple storage cells of another type.

In the depicted embodiment, a NAND string 304 includes a series of floating gate transistors 310, daisy chained source-to-drain. A source select transistor 314 couples the source end of the NAND string 304 to a source line 316, and a drain select transistor 308 couples the drain end of the NAND string 304 to a bit line 302. In a certain embodiment, the source line 316 may be maintained at a source voltage $V_{SS}$ (e.g., 0 V, or ground), and the bit line 302 voltage may be manipulated by the sense amplifier 306 to read or write data. Word lines 312 may couple control gates of corresponding floating gate transistors 310 across multiple NAND strings 304. Thus, a full row of floating gate transistors 310 (e.g., a page of data for SLC NAND, or multiple pages of data for MLC or TLC NAND) may be addressed via a single word line 312, with individual bits read or programmed via columns or bit lines 302. In the depicted embodiment, a 3-dimensional NAND arrangement is shown, in which multiple NAND strings 304 are coupled to one bit line 302, and a bit stored by a floating gate transistor 310 is physically addressed by row (e.g., word line 312), column (e.g., bit line 302), and string 304, (e.g., selected via select transistors 308, 314). In another embodiment, in a 2-dimensional NAND arrangement, each NAND string 304 is coupled to a single bit line 302, and a bit stored by a floating gate transistor 310 is physically addressed by row (e.g., word line 312), and column (e.g., bit line 302), without separately addressing a string 304.

In the depicted embodiment, as described above, reading data from a floating gate transistor 310 may include applying a read voltage to the control gate of the floating gate transistor 310 and determining whether the floating gate transistor 310 conducts between source and drain terminals. When reading or writing data for a floating gate transistor 310, the term "selected" may be used herein to refer to the floating gate transistor 310 in question, the NAND string 304 that includes the selected floating gate transistor 310, the word line 312 coupled to the selected floating gate transistor 310, and the like. Conversely, the term "unselected" may be used herein to refer to floating gate transistors 310 other than the selected floating gate transistor 310, NAND strings 304 other than the selected NAND string 304, word lines 312 other than the selected word line 312, and the like.

In one embodiment, to read data from a selected floating gate transistor 310, the sense amplifier 306 precharges the selected bit line 302. The source select transistor 314 and the drain select transistor 308 for a selected string 304 may be turned on (e.g., a voltage may be applied to control gates so that the select transistors 308, 314 are in a conducting state). Select transistors 308, 314 for unselected strings 304 may be turned off (e.g., control gates may be at 0 V). A voltage sufficient to fully turn on the unselected floating gate transistors 310 is applied via the unselected word lines 312. A read voltage is applied to the selected floating gate transistor 310. If the threshold voltage $V_t$ for the selected floating gate transistor 310 is below the applied read voltage (e.g., the storage cell is in an erased state for SLC NAND), then the selected floating gate transistor 310 conducts, and the bit line 302 is discharged via the selected NAND string 304 coupling the bit line 302 to the source line 316. Conversely, if the voltage threshold $V_t$ for the selected floating gate transistor 310 is above the applied read voltage (e.g., the storage cell is in a programmed state for SLC NAND), then the selected floating gate transistor 310 does not conduct, and the selected NAND string 304 does not discharge the bit line 302. Applying a single read voltage may be sufficient to distinguish between programmed and erased states for SLC NAND; successive read voltages may be applied to distinguish between multiple states for MLC NAND, TLC NAND, or the like. The sense amplifier 306 may sense an electrical property of the bit line 302, such as a bit line voltage, a rate of change in a bit line voltage, a bit line current, or the like, to determine whether the bit line 302 discharges through the selected floating gate transistor 310.

In a certain embodiment, for writing as for reading, a string 304 may be selected by applying appropriate voltages to select transistors 308, 314, and unselected floating gate transistors 310 may be fully turned on by applying a sufficient voltage to unselected word lines 312. One or more program voltage pulses may be applied to the control gate for the selected floating gate transistor 310, via the selected word line 312, to change the voltage threshold $V_t$ for the selected floating gate transistor 310. Changes to the voltage threshold $V_t$ for the selected floating gate transistor 310 may be verified in a process similar to reading, by applying one or more program verify voltages to the selected floating gate transistor 310, and sensing whether the selected floating gate transistor 310 conducts.

In various embodiments, the degree to which a voltage threshold $V_t$ for a selected floating gate transistor 310 changes in response to a programming pulse depends on the size of voltage between the control gate and the drain. In one embodiment, to inhibit a cell from being programmed, a sense amplifier 306 may apply a high inhibit voltage to the drain of the selected floating gate transistor 310, via the bit line 302. In another embodiment, for fast programming, or for programming to a high voltage threshold $V_t$, a sense amplifier 306 may apply a low or zero voltage to the drain of the selected floating gate transistor 310, via the bit line 302. In certain embodiments, a sense amplifier 306 may apply a bias voltage to the drain of the selected floating gate transistor 310, via the bit line 302. In some embodiments, a small, but non-zero bias voltage may reduce program disturb phenomena that affect floating gate transistors 310 in nearby or adjacent unselected NAND strings 304. In further embodiments, a bias voltage at some level between zero volts and the inhibit voltage may effectively reduce the size of the program voltage pulses, by reducing the voltage difference between the control gate and the drain of the selected floating gate transistor 310, to slow programming, or to program the selected floating gate transistor 310 into a state with an intermediate threshold voltage $V_t$.

Read and program operations are described above in the context of reading or writing data to a single floating gate transistor 310. However, in various embodiments, a word line 312 may couple control gates for a row of floating gate transistors 310 that spans multiple NAND strings 304 and bit lines 302. Thus, a read voltage or a program voltage pulse may be applied to a word line 312, and multiple bits of data may be communicated via multiple bit lines 302, to read data from or write data to floating gate transistors 310 coupled to the selected word line 312. In some embodiments, a subset of floating gate transistors 310 coupled to the selected word line 312 may be unselected. For example, in one embodiment, strings 304 may still be individually selected as described above if multiple strings 304 are coupled to one bit line 302. In certain embodiments, a partial row may be programmed by selecting only even bit lines 302, only odd bit lines 302, or the like. However, in general, in various embodiments, data is programmed to or read from multiple floating gate transistors 310 in a row using one word line 312 and multiple bit lines 302.

To read a page of data, a read voltage may be applied to a word line 312, and sense amplifiers 306 may determine which bit lines 302 are discharged through floating gate transistors 310 coupled to the word line 312. In certain embodiment, where the range of possible threshold voltages $V_t$ for a floating gate transistor 310 is divided into more than two states, multiple pages of data may be read from the same row of floating gate transistors 310 by applying successive read voltages to the word line 312.

Similarly, to program a page of data, one or more program pulses may be applied to a word line 312 and sense amplifiers 306 may apply different voltages to different bit lines 302 to program or inhibit floating gate transistors 310 coupled to the word line 312. In one embodiment, multiple pages of data may be programmed to the same row of floating gate transistors 310 by applying inhibit voltages to different bit lines 302 at different times, or by applying different bias voltages to different bit lines 302 to affect programming speeds, so that different floating gate transistors 310 are programmed into different states.

In the depicted embodiment, the floating gate transistors 310 are NAND flash storage cells. However, in various embodiments, word lines 312 and bit lines 302 for other types of storage cells including resistive storage cells, magnetic storage cells, phase change storage cells, or the like, may be similarly arranged so that a sense amplifier 306 senses an electrical property of a bit line 302 for reading data and applies a bias voltage to a bit line 302 for writing data. Sense amplifiers 306 are described in further detail below with regard to FIGS. 4A and 4B.

Figure 4A:
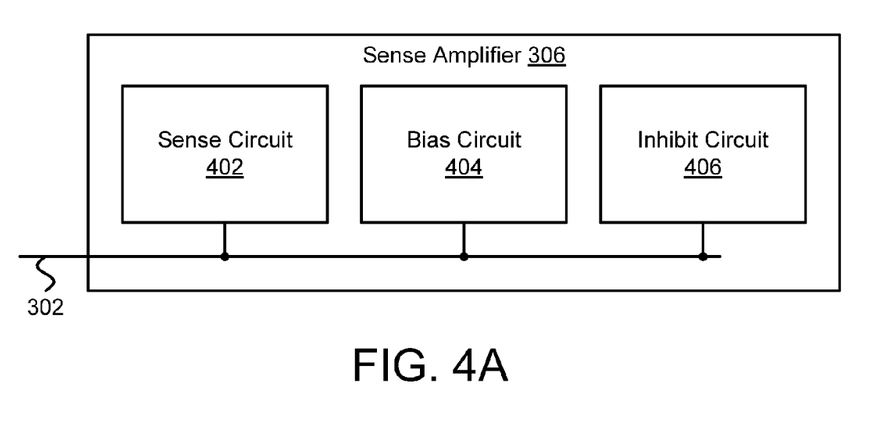
FIG. 4A is a schematic diagram illustrating one embodiment of a sense amplifier.

FIG. 4A depicts one embodiment of a sense amplifier 306, coupled to a bit line 302. The sense amplifier 306 and the bit line 302 may be substantially similar to the sense amplifier 306 and the bit line 302 described above with regard to FIG. 3. In general, as described above, the sense amplifier 306 and the bit line 302 may be included in a sense/bias component 150 that senses bit line voltages (or other electrical properties) for reading data and applies bit line bias voltages for writing data, using lower-capacitance sense circuit(s) and higher-capacitance bias circuit(s). In the depicted embodiment, the sense amplifier 306 includes a sense circuit 402, a bias circuit 404, and an inhibit circuit 406.

The bit line 302, in one embodiment, is coupled to storage cells for a non-volatile memory element 123. For example, in one embodiment, as described above with reference to FIG. 3, the bit line 302 may be coupled to one or more NAND strings via drain select transistors. In another embodiment, the bit line 302 may be coupled to storage cells other than NAND flash storage cells. In a certain embodiment, a bit line 302 may be coupled to multiple storage cells, addressable using different word lines. In a further embodiment, the sense amplifier 306 is coupled to the bit line 302. In general, in various embodiments, the bit line 302 communicates information between the sense amplifier 306 and storage cells. In the depicted embodiment, the sense amplifier 306 is directly coupled to the bit line 302. In another embodiment, an intermediate stage may be disposed between the sense amplifier 306 and the bit line 302, so that the sense amplifier 306 and the bit line 302 are indirectly coupled. A non-volatile memory element 123, in certain embodiments, may include a plurality of storage cells, a plurality of bit lines 302 coupled to the storage cells, and a plurality of sense amplifiers 306 coupled to the bit lines 302.

The sense circuit 402, in one embodiment, senses an electrical property of the bit line 302 for reading data from one or more of the storage cells coupled to the bit line 302. For example, in one embodiment, reading a data set from a non-volatile memory element 123 may include using sense circuits 402 in multiple sense amplifiers 306 to sense voltages of one or more bit lines 302 for the non-volatile memory element 123.

In various embodiments, a means for sensing a voltage for a bit line 302, for reading data from one or more storage cells of a non-volatile memory element 123, may include a sense circuit 402, a sense amplifier 306, a sense/bias component 150, sense blocks 250, a state machine 222, a die controller 220, a device controller 244, peripheral or management circuits for a non-volatile memory element 123, other logic hardware, and/or other executable code stored on a computer readable storage medium. Other embodiments may include similar or equivalent means for sensing a bit line voltage.

In various embodiments, reading data from a storage cell coupled to a bit line 302 may include preparing the bit line 302, allowing the bit line 302 to be affected by the storage cell, and sensing or detecting an electrical property of the bit line 302 to determine a state for the storage cell. For example, in one embodiment, the sense circuit 402 may prepare the bit line 302 by precharging the bit line 302. A sense circuit 402 may apply a precharge current or voltage to the bit line 302. As described above with regard to FIG. 3, the precharged bit line 302 may be allowed to be affected by the storage cell, by turning on select transistors and unselected floating gate transistors for a NAND string, so that the precharged bit line 302 is discharged through the NAND string to a source line if the storage cell conducts in response to a read voltage, and undischarged (or discharged more slowly, via leakage) if the storage cell does not conduct in response to a read voltage. The sense circuit 402 may be include or be in communication with on-chip address decoders, row decoders, word line drivers, source select drivers, drain select drivers, or the like, to select a NAND string, turn on select transistors, turn on unselected storage cells, and apply a read voltage to a selected storage cell coupled to a bit line 302. The sense circuit 402 may then sense an electrical property of the bit line 302, such as a bit line voltage, a bit line current, a rate of change in bit line voltage, or the like to determine a state for the storage cell.

Thus, in a certain embodiment, reading data from a storage cell comprises precharging the bit line 302, applying a read voltage to a control gate for the storage cell, and sensing an electrical property of the bit line 302 to determine whether the bit line 302 discharges through the storage cell. In various other embodiments, however, a bit line 302 may be prepared, affected, and sensed in various other ways. For example, if the resistance of a storage cell is varied to store data, a bit line 302 may be prepared by applying a voltage to the bit line 302, affected by connecting the bit line 302 to ground through a storage cell, and sensed by using a sense circuit 402 to detect a current through the bit line 302 that depends on the resistance of the storage cell. Various ways of preparing, affecting, and sensing bit lines 302 using a sense circuit 402, for various types of non-volatile storage cells, will be clear in view of this disclosure.

In various embodiments, various types of electrical properties of a bit line 302 may be sensed by a sense circuit 402, for reading data from one or more storage cells. An "electrical property" may refer to any electrical quantity, characteristic, property, or the like, associated with the bit line 302, such as a charge, a voltage, a current, a resistance, a capacitance, an inductance, a rate of change in any other electrical property, or the like. Different types of storage cells may affect different electrical properties of a bit line 302 in different ways, so the electrical property sensed by the sense circuit 402 may depend on the type of non-volatile medium in use. For example, flash memory cells which discharge a bit line 302 may affect a bit line voltage, a bit line current, a rate of change in bit line voltage, or the like. Various electrical properties that may be sensed by a sense circuit 402 will be clear in view of this disclosure.

In certain embodiments, a sense circuit 402 may "sense" a bit line electrical property by monitoring or detecting a value for the electrical property, detecting a change in the electrical property, or the like. In a certain embodiment, the sense circuit 402 may amplify a low-level electrical signal or otherwise convert the detected electrical property to a recognizable logic level, and may communicate with one or more data latches to store the data read from a storage cell, for eventual communication to a host, a client, or the like. Various ways of sensing electrical properties to produce and latch recognizable logic levels will be recognized in view of this disclosure.

In certain embodiments, the storage cells that are sensed by a sense circuit 402 may be selected by row (using word line drivers) by NAND string (using select transistors) or the like. In one embodiment, a data set may be stored by multiple storage cells coupled to multiple bit lines 302, and reading the data set may include using multiple sense circuits 402 to sense voltages (or other electrical properties) of the bit lines 302.

The bias circuit 404, in one embodiment, applies a bias voltage to the bit line 302 for writing data to one or more of the storage cells coupled to the bit line 302. For example, in one embodiment, writing a data set to a non-volatile memory element 123 may include using bias circuits 404 in multiple sense amplifiers 306 to apply bias voltages to one or more bit lines 302 for the non-volatile memory element 123.

In various embodiments, a means for biasing a bit line 302 to a bias voltage, for programming data to one or more storage cells of a non-volatile memory element 123, may include a bias circuit 404, a sense amplifier 306, a sense/bias component 150, sense blocks 250, a state machine 222, a die controller 220, a device controller 244, peripheral or management circuits for a non-volatile memory element 123, other logic hardware, and/or other executable code stored on a computer readable storage medium. Other embodiments may include similar or equivalent means for biasing a bit line 302.

In certain embodiments, writing data to a storage cell coupled to a bit line 302 may include applying a bias voltage to a bit line 302, and applying one or more program voltage pulses to a control gate for the storage cell. For example, in one embodiment, a storage cell may be selected (e.g., by NAND string and word line) for programming, and one or more program voltage pulses may be applied to the control gate via the word line. The bias circuit 404 may include or be in communication with word line drivers for applying program pulses. However, the same word line may be coupled to multiple storage cells, for different bit lines 302, so that a program voltage pulse applied via a word line may be used to program multiple storage cells in a single program operation. A bias voltage (or an inhibit voltage) applied to a bit line 302 by a bias circuit 404 effectively determines the strength of the program voltage pulse by affecting the gate-drain voltage for the storage cell. Thus, in one embodiment, bias circuits 404 may apply lower bias voltages for faster programming (with a larger difference between a high program pulse voltage and a drain voltage), or for programming to a higher threshold voltage. Conversely in another embodiment, bias circuits 404 may apply higher bias voltages for slower, more precise programming (with a smaller difference between a high program pulse voltage and a drain voltage), or for programming to an intermediate threshold voltage. Accordingly, in a certain embodiment, a set of program voltage pulses applied to multiple storage cells via a word line may be used to program the storage cells to different states, to store different data values (or to leave some cells unprogrammed), by applying different bias and/or inhibit voltages to different bit lines 302.

In one embodiment, a bias circuit 404 may apply a bias voltage to a bit line 302 by coupling a voltage reference or a voltage source to the bit line 302. In another embodiment, a bias circuit 404 may couple a current source to the bit line 302 to affect the bias voltage. In a further embodiment, a bias circuit 404 may use another electrical property suited to the type of storage medium (as described above with regard to reading data), to bias a bit line 302 for programming data to a storage cell. In one embodiment, a bias voltage may be within a range from a negative voltage supply (e.g., for erasing) to a high positive voltage supply (e.g., for program pulses). In another embodiment, a bias voltage may be within a range from 0 volts to an inhibit voltage. In a certain embodiment, a bias voltage may be within a range from zero to three volts. In a further embodiment, the bias circuit 404 may apply bias voltages within a range, according to a predefined step size. For example, in one embodiment, the bias circuit 404 may apply a bias voltage in a range from zero to three volts with a 100 mV step size, so that there are approximately 30 different bias voltages that the bias circuit 404 can apply to a bit line 302.

In one embodiment, the bias circuit 404 may apply a bias voltage based on a latched data value. For example, in one embodiment, a latch may store a bit of data to write via a bit line 302, and the bias circuit 404 may apply a bias voltage based on the latched data. In another embodiments, a set of latches may store multiple data values to write via a bit line 302 (e.g., data values for upper, lower, and middle pages), and the bias circuit 404 may apply a bias voltage based on the latched data, to program a storage cell into a state that represents the multiple data values (e.g., one of eight possible states, to store three bits of data).

In certain embodiments, the storage cells that are affected by a bias circuit 404 may be selected by row (using word line drivers) by NAND string (using select transistors) or the like. In one embodiment, a data set may be stored by multiple storage cells coupled to multiple bit lines 302, and writing the data set may include using multiple bias circuits 404 to apply different bias voltages to different bit lines 302 (or to otherwise bias a set of bit lines 302 differently based on some electrical property).

In one embodiment, within a sense amplifier 306, a capacitance of a bias circuit 404 may be greater than a capacitance for a sense circuit 402. Similarly, in a further embodiment, where multiple sense amplifiers 306 include multiple sense circuits 402 and multiple bias circuits 404, capacitances for bias circuits 402 may be greater than capacitances for sense circuits 402.

In various embodiments, a capacitance of a sense circuit 402 may affect the time for precharging and discharging a bit line 302—a higher capacitance coupled to the bit line 302 may increase both the precharge and discharge times. Thus, low sense circuit 402 capacitances may facilitate fast sensing for read or program verify operations.

In certain embodiments, a capacitance of a bias circuit 404 may affect programming speed and/or stability. A low capacitance bias circuit 404 may allow a bias voltage for a bit line 302 to be quickly changed, compared to a high capacitance bias circuit 404. However, in some embodiments, program operations may take significantly longer than read operations, due to applying multiple program pulses, program verify pulses, and the like. In further embodiments, with long program operations, program speed may be less significant than program stability. In the course of a long program operation, a bit line bias voltage may be affected by leakage currents. However, coupling a high capacitance to the bit line 302 when applying a bias voltage for writing data, may stabilize the bias voltage, making it less susceptible to the effects of leakage currents.

Accordingly, in various embodiments, a low capacitance sense circuit 402 may facilitate fast sensing, and a high capacitance bias circuit 404 may facilitate stable programming. In certain embodiments, a sense circuit 402 capacitance may be less than a bias circuit 404 capacitance. In one embodiment, for example, a sense circuit 402 capacitance may be less than half a bias circuit 404 capacitance. In a certain embodiment, to provide a further example, a sense circuit 402 capacitance may be less than 5 femtofarads, and a bias circuit 404 capacitance may be greater than 10 femtofarads.

In one embodiment, therefore, a sense circuit 402 may be designed to have a low capacitance. In a certain embodiment, a "parasitic" capacitance may refer to internal capacitances of circuit components, capacitance between circuit elements, or the like, apart from elements that are intentionally included for their capacitive properties (e.g., capacitors). In a certain embodiment, a capacitance of the sense circuit 402 may comprise, or primarily comprise parasitic capacitance. In other words, in such an embodiment, no circuit element is added for the purpose of increasing sense circuit 402 capacitance.

In one embodiment, a capacitance for a bias circuit 404 may be selected based on a programming speed for a non-volatile memory element 123. For example, in a certain embodiment, a programming speed may affect a length of time for applying a bias voltage to a bit line 302 during programming, and the capacitance of the bias circuit 404 may be selected to provide a stable bit line voltage for that length of time. In a further embodiment, a manufacturer may select a bias circuit 404 capacitance based on a programming speed by adjusting or selecting the bias circuit 404 capacitance to balance stability and speed for a program operation.

In certain embodiments, a capacitance for a bias circuit 404 may be selected by intentionally adding some capacitive element to the bias circuit 404, so that the capacitance for the bias circuit 404 includes natural or parasitic capacitance, and the intentionally added capacitance. For example, a manufacturer for a non-volatile memory element 123 may add a metal-oxide-semiconductor (MOS) capacitor, a MOS transistor with a capacitance between gate and substrate layers, or the like, to a bias circuit 404 to increase the capacitance of the bias circuit 404.

Certain sense amplifiers for non-volatile media include sense circuitry and bias circuitry, where the bias circuitry is not isolated from the sense circuitry. Thus, the capacitance of the sense amplifier is substantially the same whether sensing or biasing. In such a sense amplifier, reducing the sense amplifier capacitance may provide faster sensing at the expense of program stability, and increasing the sense amplifier capacitance map provide greater program stability at the expense of sensing speed. By contrast, the present disclosure, in the depicted embodiment, provides a sense amplifier 306 with a sense circuit 402 distinct or separate from the bias circuit 404, so that sense circuit 402 capacitance and bias circuit 404 capacitance are substantially independent within the same sense amplifier 306. In various embodiments, electrically separating a sense circuit 402 and a bias circuit 404 within the same sense amplifier 306 may provide both stable programming and fast sensing.

In the depicted embodiment, the sense circuit 402 and the bias circuit 404 are electrically coupled to the bit line 302 separately and/or in parallel. As used herein, circuits or components may be said to be electrically connected to a bit line 302 "separately" and/or "in parallel" if the output of each circuit is coupled to the bit line 302 independently of the other circuits (e.g., without passing through one of the other circuits, to form separate and/or split electrical paths within the sense amplifier 306). In certain embodiments, different circuits may be coupled to different voltage or power sources, but may still be referred to as being "separate" and/or "in parallel" based on parallel or independent outputs, even with different inputs, or the like. By contrast, a series arrangement, with the output of the bias circuit 404 passing through the sense circuit 402 or vice versa, could present an effective capacitance to the bit line 302 that is less than the capacitance of the sense circuit 402 or the bias circuit 404 individually. A reduced effective capacitance, in certain embodiments, may facilitate fast sensing, without facilitating stable voltage biasing.

By contrast, in the depicted embodiment, with the sense circuit 402 and the bias circuit 404 coupled to the bit line 302 separately and in parallel (e.g., providing separate and/or split electrical paths), the sense amplifier 306 may present an effective capacitance to the bit line 302 that includes the sum of capacitances for the sense circuit 402 and the bias circuit 404 individually. If the bit line 302 "sees" (e.g., is coupled to) a large effective capacitance when sensing, the speed of precharge and discharge operations may be negatively affected. Thus, in certain embodiments, the bias circuit 404 may be electronically isolated from the bit line 302 when the sense circuit 402 is in use. For example, a transistor may disconnect the bias circuit 404 from the bit line 302 when the sense circuit 402 is in use, and may reconnect the bias circuit 404 to the bit line 302 to apply a bias voltage. A bias circuit 404 including an isolation transistor is described in further detail below with regard to FIG. 4B.

In a further embodiment, the sense circuit 402 may similarly be disconnected from the bit line 302 when the bias circuit 404 is in use. However, because the bias circuit 404 capacitance is already larger than the sense circuit 402 capacitance, for bias voltage stability, there may be few or no negative effects if the bit line 302 also "sees" the sense circuit 402 capacitance in addition to the bias circuit 404 capacitance during biasing. Conversely, disconnecting the larger-capacitance bias circuit 404 when the smaller-capacitance sense circuit 402 is in use avoids coupling a large capacitance to the bit line 302, so that the bias circuit 404 does not significantly slow sensing operations. In another embodiment, however, the sense circuit 402, the bias circuit 404, and/or the inhibit circuit 406 may each be electrically isolated or disconnected from the bit line 302 when not in use.

In various embodiments, the sense circuit 402, the bias circuit 404, and/or the inhibit circuit 406 may be referred to as "electronically isolated" from the bit line 302 if the capacitance of the circuit 402, 404, 406 is substantially decoupled from the bit line 302. Some leakage current or parasitic capacitance may still be "seen" by the bit line 302 in certain embodiments, even when a circuit 402, 404, 406 is electronically isolated from the bit line 302, but the circuit 402, 404, 406 may still be referred to as electronically isolated from the bit line 302 if it is decoupled from the bit line 302 in some way, such as by a transistor or another active switching element.

The inhibit circuit 406, in one embodiment, applies an inhibit voltage to the bit line 302 for inhibiting programming of one or more storage cells. In the depicted embodiment, sense amplifier 306 includes an inhibit circuit 406 separate from the sense circuit 402 and the bias circuit 404. In another embodiment, however, the bias circuit 404 may apply an inhibit voltage to a bit line 302, and a separate inhibit circuit 406 may be omitted from the sense amplifier 306.

In various embodiments, a means for applying an inhibit voltage to a bit line 302, for inhibiting programming of one or more storage cells of a non-volatile memory element 123, may include an inhibit circuit 406, a bias circuit 404, a sense amplifier 306, a sense/bias component 150, sense blocks 250, a state machine 222, a die controller 220, a device controller 244, peripheral or management circuits for a non-volatile memory element 123, other logic hardware, and/or other executable code stored on a computer readable storage medium. Other embodiments may include similar or equivalent means for applying a bit line inhibit voltage.

As described above, applying an inhibit voltage to a bit line 302 may prevent a storage cell coupled to the bit line 302 from being programmed when program voltage pulses are applied to the word line. In certain embodiment, an inhibit voltage that inhibits programming may be higher than a bias voltage that merely affects the speed of programming, or a state to which a cell is programmed. In one embodiment, an inhibit circuit 406 may apply an inhibit voltage by coupling the bit line 302 to a high voltage source for the sense amplifier 306. Other ways of applying bit line inhibit voltages will be clear in view of this disclosure.

Figure 4B:
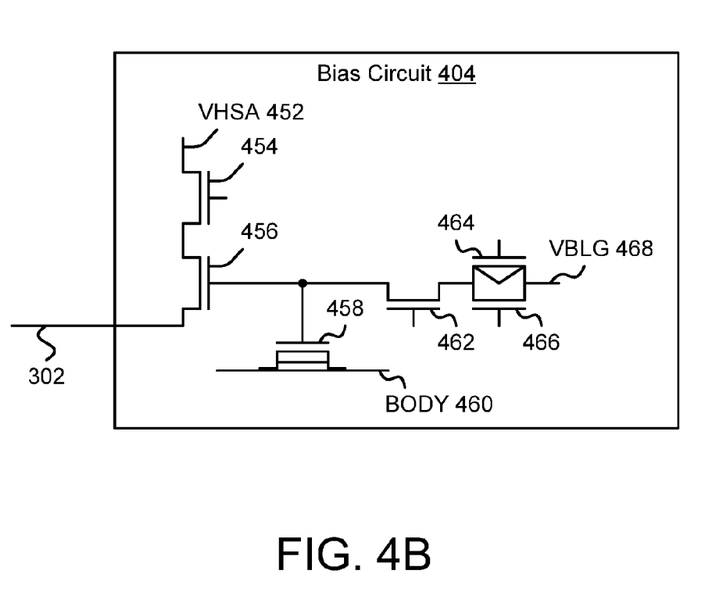
FIG. 4B is a schematic diagram illustrating one embodiment of a bias circuit for a sense amplifier.

FIG. 4B depicts one embodiment of a bias circuit 404 for a sense amplifier, coupled to a bit line 302. The bias circuit 404 and the bit line 302, in the depicted embodiment, may be substantially similar to the bias circuit 404 and bit line 302 described above with reference to FIG. 3 and FIG. 4A. In the depicted embodiment, the bias circuit 404 comprises multiple lines or terminals 452, 460, 468, which couple to voltages or components outside the bias circuit 404, and multiple transistors 454, 456, 458, 462, 464, 466.

In the depicted embodiment, the VHSA line 452 couples to VHSA, a high voltage source for the sense amplifier. When transistors 454 and 456 are turned on, VHSA is coupled to the bit line 302 for biasing. Thus, the VHSA line 452 provides the bias voltage for biasing the bit line 302. In a certain embodiment, as described above, the voltage on the VHSA line 452 may be controlled between 0 and 3 volts, with a 100 mV step size. In another embodiment, the VHSA line 452 may be configured to provide a different range of bias voltages, and/or different step sizes within the range.

In the depicted embodiment, the VBLG line 468 couples to VBLG, a voltage source for activating the bias circuit 404. When the voltage on the VBLG line 468 is coupled to transistor 456, the bias circuit 404 is activated, or coupled to the bit line 302. Otherwise, transistor 456 is switched off, and the bias circuit 404 is deactivated, or isolated from the bit line 302.

As described above with regard to FIG. 4A, the bias circuit 404 may be electronically isolated from the bit line 302 when the sense circuit is in use, so that the bit line 302 "sees" or is connected to the lower sense circuit capacitance, and not the higher bias circuit 404 capacitance, when the sense circuit is in use. In the depicted embodiment, transistor 456 isolates the bias circuit 404 from the bit line 302 when the sense circuit is in use, when the bias circuit 404 is not in use, or the like. In the depicted embodiment, the transistor that isolates the bias circuit 404 from the bit line 302 is part of the bias circuit 404. In another embodiment, an isolation transistor or another active switching element may be provided by the sense amplifier, between the bias circuit 404 and the bit line 302. In certain embodiments, leakage current across transistor 454 may expose some capacitance of the bias circuit 404 to the bit line 302, even when transistor 454 is turned off. However, transistor 454 may still be said to electrically "isolate" the bias circuit 404 from the bit line 302 when transistor 454 is turned off.

In the depicted embodiment, transistors 464 and 466 comprise a PMOS transistor 464 and an NMOS transistor 466. Control gates for the transistors 464 and 466 may be coupled to complementary outputs of a data latch, so that both transistors 464, 466 turn on and off together based on the data latch value. Thus, the bias circuit 404 may communicate with a data latch so that the bias voltage applied to the bit line 302 depends on a value in a data latch, to be written to a storage cell via the bit line 302.

In the depicted embodiment, transistor 462 limits leakage current from the VBLG line 468. Leakage current through the parallel PMOS and NMOS transistors 464, 466 described above may be significant even when the transistors are off. In the absence of transistor 462, such leakage current may couple the voltage on the VBLG line 468 to the transistor 456, which may activate the bias circuit 404, or at least couple the capacitance of the bias circuit 404 to the bit line 302. Accordingly, in certain embodiments, the bias circuit 404 includes a transistor 462 that limits leakage current from a voltage source (such as the voltage on the VBLG line 468) that activates the bias circuit 404.

In one embodiment, as described above with regard to FIG. 4A, the bias circuit 404 may include a component or element that increases the capacitance of the bias circuit 404 beyond parasitic capacitance. For example, a manufacturer may add a MOS capacitor or other capacitor to the bias circuit 404 to provide a suitably high capacitance for the bias circuit 404. In the depicted embodiment, the bias circuit 404 comprises a field effect transistor 458 configured such that the capacitance of the bias circuit 404 comprises a capacitance between a gate and a substrate for the field effect transistor 458. In a further embodiment, the substrate of the field effect transistor 458 is connected to the BODY terminal 460, which may be grounded. In one embodiment, the BODY terminal may be a substrate for an integrated circuit comprising the bias circuit 404, the sense amplifier, and/or the memory array. In certain embodiments, the oxide (or other dielectric) layer between the gate and the substrate of transistor 458 acts as the dielectric for a capacitor, so that there is a capacitance between the gate and the substrate. In certain embodiments, transistor 458 may be selected or manufactured to provide a selected capacitance. In one embodiment, transistor 458 may be a depletion mode field effect transistor (as indicated by the line across transistor 458 in FIG. 4B). In another embodiment, transistor 458 may be an enhancement mode capacitor. However, in certain embodiments, using a depletion mode transistor 458 may provide flexibility to use the transistor as a capacitive element without imposing a requirement that the gate-to-source voltage be positive. In further embodiments, intentionally providing some capacitive element such as transistor 458 for the bias circuit 404 may provide more consistency across multiple bias circuits 404 than relying on parasitic capacitance, metacapacitance, or other factors that may vary significantly with process variations, to provide the capacitance of the bias circuit 404.

Figure 5:
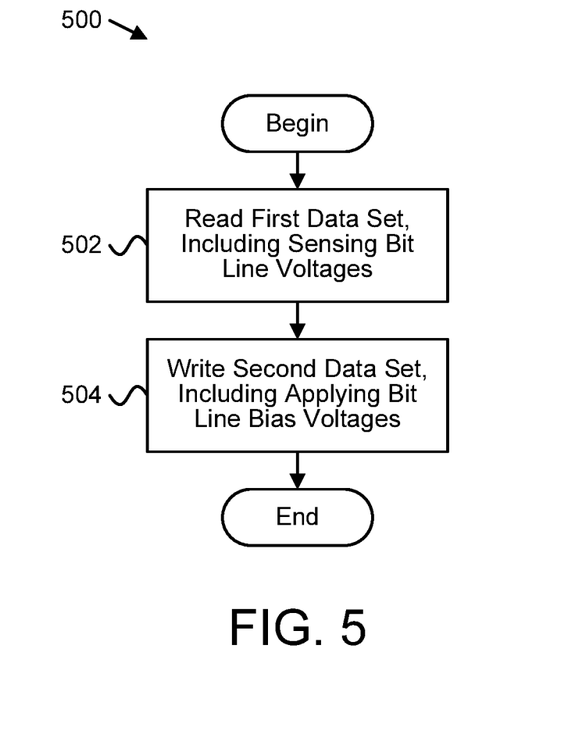
FIG. 5 is a schematic flow chart diagram illustrating one embodiment of a method for accessing non-volatile memory.

FIG. 5 is a schematic flow chart diagram illustrating one embodiment of a method 500 for accessing non-volatile memory. The method 500 begins, and sense amplifiers 306 read 502 a first data set from a non-volatile memory element 123. Reading 502 the first data set may include using sense circuits 402 to sense voltages of one or more bit lines 302. The sense amplifiers 306 write 504 a second data set to the non-volatile memory element 123, and the method 500 ends. Writing 504 the second data set may include using bias circuits 404 to apply bit line bias voltages. Capacitances of the bias circuits 404 may be greater than capacitances of the sense circuits 402.

Figure 6:
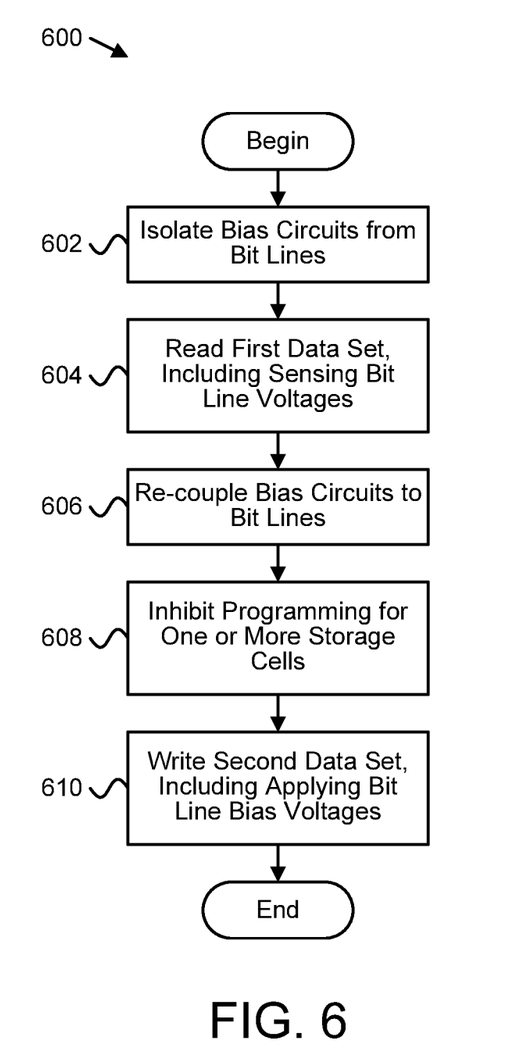
FIG. 6 is a schematic flow chart diagram illustrating a further embodiment of a method for accessing non-volatile memory.

FIG. 6 is a schematic flow chart diagram illustrating a further embodiment of a method for accessing non-volatile memory. The method 600 begins, and sense amplifiers 306 isolate 602 bias circuits 404 from bit lines 302 of a non-volatile memory element 123. The sense amplifiers 306 read 604 a first data set from t non-volatile memory element 123. Reading 604 the first data set may include using sense circuits 402 to sense voltages of one or more bit lines 302. The sense amplifiers 306 recouple 606 the bias circuits to the bit lines 302, and inhibit 608 programming for one or more storage cells. Inhibiting 608 programming may include using bias circuits 404 or inhibit circuits 406 to apply inhibit voltages to certain bit lines 302. The sense amplifiers 306 write 610 a second data set to the non-volatile memory element 123, and the method 600 ends. Writing 600 the second data set may include using bias circuits 404 to apply bit line bias voltages. Capacitances of the bias circuits 404 may be greater than capacitances of the sense circuits 402.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
    a bit line coupled to storage cells for a non-volatile memory element; and
    a sense amplifier coupled to the bit line, the sense amplifier comprising
        a sense circuit that senses an electrical property of the bit line for reading data from one or more of the storage cells; and
        a bias circuit that applies a bias voltage to the bit line for writing data to one or more of the storage cells, wherein the bias circuit and the sense circuit comprise separate parallel electrical paths within the sense amplifier, and a capacitance of the bias circuit is greater than a capacitance of the sense circuit.

2. The apparatus of claim 1, wherein, to read data from one of the storage cells, the bit line is precharged, a read voltage is applied to a control gate for the storage cell, and the sense circuit senses the electrical property of the bit line to determine whether the bit line discharges through the storage cell.

3. The apparatus of claim 1, wherein, to write data to one of the storage cells, the bias circuit applies the bias voltage to the bit line and one or more program voltage pulses are applied to a control gate for the storage cell.

4. The apparatus of claim 1, wherein the sense circuit and the bias circuit are coupled to the bit line in parallel, the sense amplifier further comprising a transistor that electronically isolates the bias circuit from the bit line when the sense circuit is in use.

5. The apparatus of claim 1, wherein the bias circuit comprises one or more transistors that limit leakage current from a voltage source that activates the bias circuit.

6. The apparatus of claim 1, wherein the capacitance of the sense circuit primarily comprises parasitic capacitance.

7. The apparatus of claim 1, wherein the capacitance of the bias circuit is selected based on a programming speed for the non-volatile memory element.

8. The apparatus of claim 1, wherein the bias circuit comprises a field effect transistor configured such that the capacitance of the bias circuit comprises a capacitance between a gate and a substrate for the field effect transistor.

9. The apparatus of claim 8, wherein the transistor comprises a depletion mode field effect transistor.

10. The apparatus of claim 1, wherein the sense amplifier further comprises an inhibit circuit that applies an inhibit voltage to the bit line for inhibiting programming of one or more of the storage cells.

11. The apparatus of claim 1, wherein the bias circuit applies an inhibit voltage to the bit line for inhibiting programming of one or more of the storage cells.

12. The apparatus of claim 1, wherein the bias voltage is within a range from zero to three volts.

13. A method comprising:
    reading a first data set from a non-volatile storage element, the non-volatile storage element comprising a plurality of storage cells, a plurality of bit lines coupled to the storage cells, and a plurality of sense amplifiers coupled to the bit lines, wherein reading the first data set comprises sensing voltages of one or more of the bit lines; and writing a second data set to the non-volatile storage element, wherein writing the second data set comprises applying bias voltages to one or more of the bit lines, the sense amplifiers comprising sense circuits for sensing bit line voltages and bias circuits for applying bit line bias voltages, wherein the bias circuits and the sense circuits are separately coupled to the bit lines in parallel and capacitances of the bias circuits are greater than capacitances of the sense circuits.

14. The method of claim 13, further comprising electronically isolating the bias circuits from the bit lines when the sense circuits are in use.

15. The method of claim 13, further comprising inhibiting programming of one or more of the storage cells, wherein the sense amplifiers further comprise inhibit circuits for applying bit line inhibit voltages.

16. An apparatus comprising:

means for sensing a voltage for a bit line, for reading data from one or more storage cells of a non-volatile memory element comprising a plurality of storage cells; and means for biasing the bit line to a bias voltage, for programming data to one or more of the storage cells, wherein a sense amplifier comprises the means for sensing and the means for biasing, and a capacitance of the means for sensing is less than a capacitance of the means for biasing.

17. The apparatus of claim 16, further comprising means for applying an inhibit voltage to the bit line, for inhibiting programming of one or more of the storage cells.

18. The apparatus of claim 16, wherein the means for sensing and the means for biasing comprise separate parallel electrical paths within the sense amplifier.

19. The apparatus of claim 16, wherein the means for biasing comprises one or more transistors that limit leakage current from a voltage source that activates the means for biasing.

20. The apparatus of claim 16, wherein the capacitance of the means for sensing primarily comprises parasitic capacitance and the means for biasing comprises a field effect transistor configured such that the capacitance of the means for biasing comprises a capacitance between a gate and a substrate for the field effect transistor.

* * * * *